(12) United States Patent
Lim et al.

(10) Patent No.: US 8,981,386 B2
(45) Date of Patent: Mar. 17, 2015

(54) ORGANIC LIGHT EMITTING DISPLAY DEVICE AND MANUFACTURING METHOD THEREOF

(71) Applicant: Samsung Display Co., Ltd., Yongin, Gyeonggi-Do (KR)

(72) Inventors: Jae-Ik Lim, Yongin (KR); Won-Sang Park, Yongin (KR); Hae-Yun Choi, Yongin (KR); Gee-Bum Kim, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 84 days.

(21) Appl. No.: 13/739,990

(22) Filed: Jan. 11, 2013

(65) Prior Publication Data

US 2014/0027725 A1    Jan. 30, 2014

(30) Foreign Application Priority Data

Jul. 25, 2012   (KR) ........................ 10-2012-0081343

(51) Int. Cl.
| | | |
|---|---|---|
| H01L 27/15 | (2006.01) | |
| H01L 29/26 | (2006.01) | |
| H01L 31/12 | (2006.01) | |
| H01L 33/00 | (2010.01) | |
| H01L 51/52 | (2006.01) | |
| H01L 27/32 | (2006.01) | |

(52) U.S. Cl.
CPC ........ H01L 51/5284 (2013.01); H01L 51/5275 (2013.01); H01L 27/322 (2013.01)
USPC ............... 257/79; 438/29; 362/231; 313/504; 345/690

(58) Field of Classification Search
CPC ................... H01L 51/5284; H01L 2251/5315; H01L 27/14627; H01L 27/322; H01L 27/14621; H01L 27/3244; H01L 27/3246; H01L 27/3272; H01L 51/5275; G02F 1/133526; G02F 1/133621; G02F 1/133514; G02F 2001/133354; G02F 2201/40; G02F 1/133345; G02F 1/133509; G02F 1/133512; G02F 1/133603; G02F 1/134336; G02F 2001/133616; G02F 2201/52
See application file for complete search history.

(56) References Cited

U.S. PATENT DOCUMENTS

| | | | | |
|---|---|---|---|---|
| 7,990,058 | B2 * | 8/2011 | Cok et al. | 313/506 |
| 2006/0060870 | A1 * | 3/2006 | Park et al. | 257/88 |
| 2010/0053535 | A1 * | 3/2010 | Kim et al. | 349/155 |
| 2012/0074397 | A1 * | 3/2012 | Okumoto | 257/40 |
| 2012/0286305 | A1 * | 11/2012 | Sasaki et al. | 257/89 |

FOREIGN PATENT DOCUMENTS

| | | | |
|---|---|---|---|
| KR | 10-2007-0049223 | A | 5/2007 |
| KR | 10-2008-0041435 | A | 5/2008 |
| KR | 10-2009-0065104 | A | 6/2009 |
| KR | 10-2009-0126597 | A | 12/2009 |
| KR | 10-2010-0073228 | A | 7/2010 |
| KR | 10-2011-0082023 | A | 7/2011 |

* cited by examiner

*Primary Examiner* — Sonya D McCall Shepard
(74) *Attorney, Agent, or Firm* — Knobbe Martens Olson & Bear, LLP

(57) ABSTRACT

An organic light emitting display device including: a substrate; a plurality of first electrodes formed over the substrate; a pixel defining layer (PDL) formed over the substrate, and separating the plurality of first electrodes from one another when viewed in a thickness direction of the display device; a plurality of light emitting layer portions formed over one of the plurality of first electrodes; at least a second electrode formed over the plurality of light emitting layer portions; and a filter unit formed over the at least a second electrode. The filter unit includes a black matrix layer defining a plurality of openings, an organic layer formed over the black matrix layer and the plurality of openings, and comprising a plurality of lens-shaped embossed portions, and a plurality of color filters formed over the organic layer.

24 Claims, 11 Drawing Sheets

ORGANIC LIGHT EMITTING DISPLAY DEVICE AND MANUFACTURING METHOD THEREOF

CROSS-REFERENCE TO RELATED APPLICATIONS

This application is based on and claims priority from Korean Patent Application No. 10-2012-0081343, filed on Jul. 25, 2012, with the Korean Intellectual Property Office, the present disclosure of which is incorporated herein in its entirety by reference.

TECHNICAL FIELD

The present disclosure relates to an organic light emitting display device and a manufacturing method thereof.

BACKGROUND

An organic light emitting display device is in the limelight as a next-generation display because of merits such as low voltage driving, a light and thin film type, a wide viewing angle, and a rapid response speed. In particular, recently, researches on a flexible display apparatus using an organic light emitting device have been actively in progress.

When the organic light emitting display device is viewed under an environment in which external light such as sunlight exists, there is a problem in that visibility is deteriorated due to light reflected onto the device.

SUMMARY

One aspect provides an organic light emitting display device capable of preventing visibility from being deteriorated due to external light and improving a viewing angle characteristic.

An embodiment provides an organic light emitting display device, including: a substrate; a plurality of first electrodes formed over the substrate; a pixel defining layer (PDL) formed over the substrate, and separating the plurality of first electrodes from one another when viewed in a thickness direction of the display device; a plurality of light emitting layer portions, each of which formed over one of the plurality of first electrodes; at least a second electrode formed over the plurality of light emitting layer portions; and a filter unit formed over the second electrode, in which the filter unit includes a black matrix layer defining a plurality of openings, an organic layer formed over the black matrix layer and the plurality of openings, and comprising a plurality of lens-shaped embossed portions, and a plurality of color filters formed over the organic layer.

The plurality of light emitting layer portions may include a red light emitting layer portion, a green light emitting layer portion, and a blue emitting layer portion, and the plurality of color filters may include a red filter, a green filter, and a blue filter which correspond to the red light emitting layer portion, the green light emitting layer portion, the blue light emitting layer portion, respectively.

Each of the plurality of light emitting layer portions may include a white light emitting material, and the plurality of color filters may include a red filter, a green filter and a blue filter, each of which is disposed over the white light emitting material of one of the light emitting layer portions.

The black matrix may be formed to overlap the pixel defining layer when viewed in the thickness direction.

The black matrix may have a light absorptive property.

Each of the lens-shaped embossed portions may have a convex-lens shape.

Each of the lens-shaped embossed portions may have a concave-lens shape.

The plurality of first electrodes, the plurality of light emitting layer portions and the at least a second electrode may be configured to form a plurality of pixels which are separated from one another by the pixel defining layer when viewed in the thickness direction, the plurality of lens-shaped embossed portions are formed at an area corresponding to the plurality of pixels.

One of the plurality of embossed portions may be formed for each of the plurality of pixels.

Two or more embossed portions among the plurality of embossed portions may be formed for each of the plurality of pixels.

A refractive index of the convex lens-shaped embossed portions may be about 1.7 or more.

The organic layer may be formed by containing a negative photoresist composition.

The negative photoresist composition may be made of novolac resin, hexa methoxy methyl melamine (HMMM) and SU-8-based materials.

A refractive index of the concave lens-shaped embossed portions may be about 1.3 or less.

The organic layer may be formed by containing a positive photoresist composition.

The positive photoresist composition may be made of poly methyl methacrylate (PMMA), poly methyl glutarimide (PMGI), phenol formaldehyde resin (DNQ/Novolac) and AZ-based materials.

An angle between the embossed portion and a surface paraller to the substrate may be in the range of about 15 degrees to about 70 degrees.

A plurality of thin film transistor layers may be formed over the substrate, and an insulation layer may be formed over the plurality of thin film transistor layers.

A protective layer may be formed between the second electrode and the filter unit.

At least one of a hole injection layer (HIL) and a hole transfer layer (HTL) may be disposed between the first electrode and one of the light emitting layer portions.

At least one of an electron injection layer (ETL) and an electron transfer layer (ETL) and an electron injection layer (EIL) may be included between one of the light emitting layer portions and the second electrode.

Another embodiment provides a method of making an organic light emitting display device, including: forming a black matrix having an opening over a thin film encapsulation layer; forming an organic layer over the black matrix; exposing the entire surface of the organic layer to light; developing the organic layer; and forming a color filter compatible with a light emitting layer over the organic layer and flattening the color filter.

The organic layer may contain a positive photoresist composition.

The organic layer may contain a negative photoresist composition.

According to the embodiments, it is possible to improve visibility of external light and a viewing angle characteristic in the organic light emitting display device. Further, it is possible to simplify a manufacturing process in the organic light emitting display device.

The foregoing summary is illustrative only and is not intended to be in any way limiting. In addition to the illustrative aspects, embodiments, and features described above, fur-

DETAILED DESCRIPTION

Hereinafter, embodiments will be described in more detail with reference to the accompanying drawings. The scope of the present invention is not limited to embodiments to be described below and the accompanying drawings. Embodiments to be described below and illustrated in the drawings may be modified and utilized in various different ways.

For reference, respective components and shapes thereof are schematically drawn or exaggeratedly drawn in the accompanying drawings for easy understanding. Like reference numerals designate like elements throughout the drawings.

It will be understood that when a layer or an element is described as being "on" another layer or element, it may be directly disposed on another layer or element, or an intervening layer or element may also be present.

Figure 1:
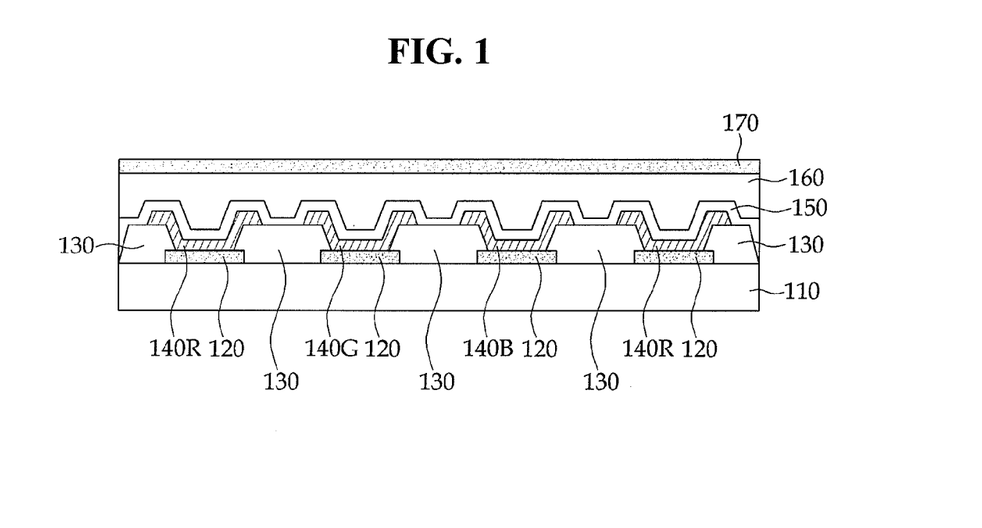
FIG. 1 is a diagram illustrating an organic light emitting display device to which a polarizer or polaroid film is attached.

As an example for solving the problem regarding the visibility, as illustrated in FIG. 1, a method of attaching a polarizer or a polaroid film onto an encapsulation layer of the organic light emitting display device may be applied.

The organic light emitting display device illustrated in FIG. 1 includes a substrate 110, a first electrode 120 disposed on the substrate 110, a pixel defining layer 130 for sectioning the first electrode 120, light emitting layers 140R, 140G, and 140B formed on the first electrode 120, a second electrode 150 formed on the light emitting layer 140, and a protective layer 160 formed on the second electrode 150, and a polarizer or polaroid film which is polarized in one direction in order to prevent reflection of external light is disposed on the protective layer 160.

As illustrated in FIG. 1, by attaching the polarizer or polaroid film to the organic light emitting display device, it is possible to prevent reflection due to external light. However, there may still be a problem in that extraction efficiency of light generated from the light emitting layer is reduced due to the polarizer or polaroid film.

Figure 2:
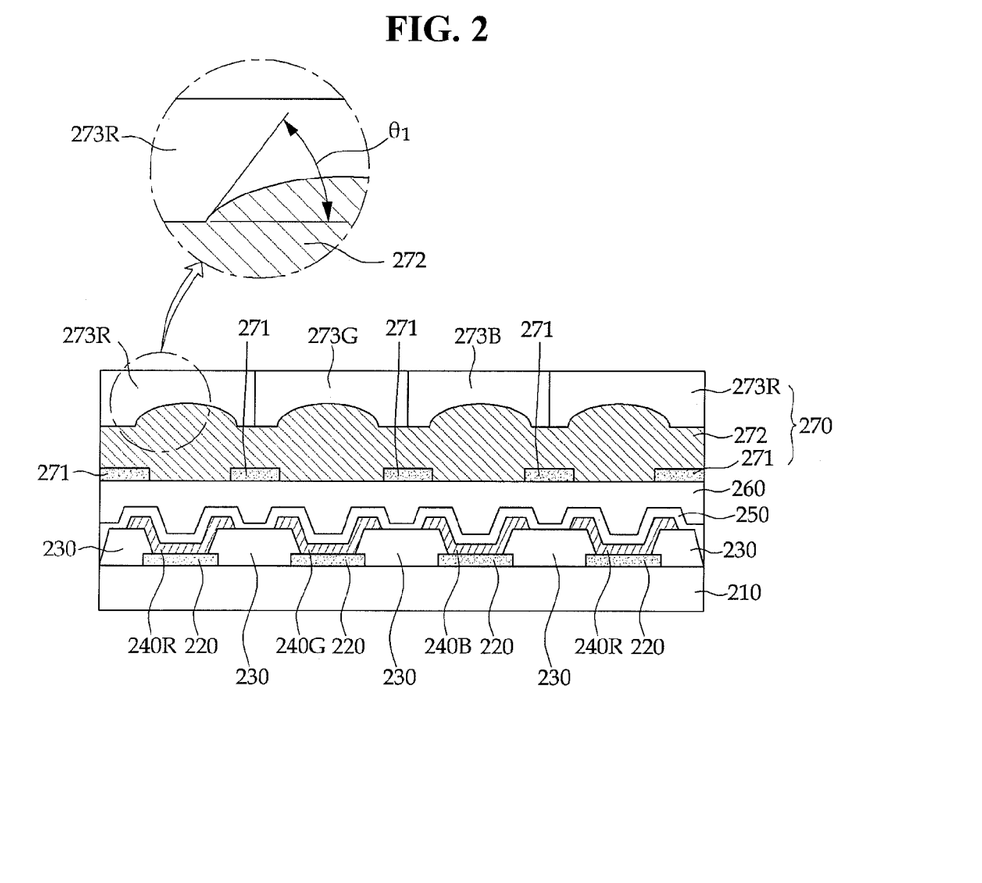
FIG. 2 is a diagram illustrating an organic light emitting display device according to an embodiment.

FIG. 2 is a diagram illustrating an organic light emitting display device according to an embodiment.

In embodiments, the organic light emitting display device of FIG. 2 includes a substrate 210, a plurality of first electrodes 220 formed on the substrate 210, a pixel defining layer 230 formed on the substrate and separating the plurality of first electrodes 220 from one another when viewed in a thickness direction of the display device, a plurality of light emitting layers 240R, 240G, and 240B formed above the first electrodes 220, a second electrode 250 formed above the light emitting layer 240, a protective layer 260 formed on the second electrode 250, and a filter unit 270 formed above the protective layer 260. Here, the filter unit 270 includes a black matrix 271 formed at a position overlapping with the pixel defining layer 230 when viewed in the thickness direction, an organic layer 272 formed on the protective layer 260 where the black matrix 271 is patterned, and color filters 273R, 273G, and 273B formed above the organic layer 272 and having colors corresponding to the light emitting layers 240R, 240G, and 240B.

The substrate 210 may be made of various materials such as glass, metal, and plastic and may be formed by using a flexible material. In the case of a rear light emission in which an image is implemented in a substrate direction, the substrate 210 needs to be made of a light transmitting material, but in the case of a front light emission, the substrate 210 is not necessarily required to be made of the light transmitting material. Hereinafter, for uniformly describing, a front light emission type organic light emitting display device will be described as an example.

The first electrode 220 may be formed on the substrate 210. The first electrode 220 may include a reflective layer which is made of gold (Au), platinum (Pt), nickel (Ni), tungsten (W), chromium (Cr), molybdenum (Mo), iron (Fe), cobalt (Co), copper (Cu), palladium (Pd), titanium (Ti), and compounds thereof. In addition to the reflective layer, the first electrode 220 may further include a transparent layer which is made of indium tin oxide (ITO) and indium zinc oxide (IZO), which have a high work function. In addition, the first electrode 220 may be made of various materials which are known in the art. Further, the first electrode 220 may act as an anode electrode.

Although not illustrated in FIG. 2, a thin film transistor and an insulation layer protecting the thin film transistor may be further included between the substrate 210 and the first electrode 220. In this case, at least one thin film transistor is formed for each pixel and may be electrically connected with the first electrode 220.

In embodiments, the pixel defining layer (PDL) 230 may be formed over the substrate and may separate the first electrodes 220 from one another when viewed in a thickness direction of the display device to form a plurality of pixels. The pixel defining layer 230 can serve as an insulation layer to electrically block the plurality of first electrodes 220. In embodiments, the pixel defining layer (PDL) 230 may overlap with a periphery of the first electrodes 220.

In embodiments, the pixel defining layer 230 of each pixel covers only a peripheral part of the upper surface of the first electrode 220, and the rest of the part of the first electrode 220 is not covered by the pixel defining layer 230 and may be exposed through an opening of the pixel defining layer 230. The light emitting layer 240 of each pixel to be described below may be formed in a region defined by the opening. In embodiments, a portion of the light emitting layer 240 is formed on or over the first electrode through the opening, and another portion of the light emitting layer 240 may be formed on or over the pixel defining layer 230 as illustrated in FIG. 2.

The organic light emitting display device according to FIG. 2 is exemplified as the front light emission type, and the second electrode 250 may be provided as a transmissive electrode. For example, the second electrode may be formed by a thin transflective layer which is made of metal having a low work function, that is, alkali metal such as lithium (Li) and cesium (Cs), alkaline earth metal such as magnesium (Mg), calcium (Ca) and strontium (Sr), and compounds thereof. A transparent conductive layer made of indium tin oxide (ITO) and indium zinc oxide (IZO) may be further included above or below the metal transflective layer. The second electrode 250 may act as a cathode electrode.

The light emitting layer 240 may be provided between the first electrode 220 and the second electrode 250. Although not illustrated in FIG. 2, a hole transfer layer (HTL) and a hole injection layer (HIL) may be formed between the first electrode 220 and the light emitting layer 240. Further, an electron transport layer (ETL) and an electron injection layer (EIL) may be formed between the light emitting layer 240 and the second electrode 250.

In embodiments, the plurality of light emitting layers 240 may include a red light emitting layer 240R, a green light emitting layer 240G, and a blue light emitting layer 240B.

In an alternative embodiment, each light emitting layer 240 may include a white light emitting layer, and one of a red color filter, a green color filter, and a blue color filter which may be formed on or over the white light emitting layer such that red light, green light and blue light are emitted through the red color filter, the green color filter, and the blue color filter.

The protective layer 260 for protecting the light emitting layer 240 from an external environment such as moisture or oxygen may be provided on the second electrode 250.

The protective layer 260 may be formed of a thin film encapsulation layer in which a plurality of organic layers and inorganic layers cross each other and are laminated or a transparent substrate such as encap glass.

In the case where the protective layer 260 is the thin film encapsulation layer, the protective layer 260 may include a plurality of organic layers and a plurality of inorganic layers which are alternately laminated. The organic layers may be formed by containing acrylate-based materials and the inorganic layers may be formed by containing oxide-based materials.

A black matrix 271 may be formed on or over the protective layer 260 and overlap the pixel defining layer 230 when viewed in the thickness direction.

The black matrix 271 is formed by using opaque metal such as chromium (Cr) or chromium oxide (CrOx) or a black resin-based material which absorbs light.

The black matrix 271 may absorb light exposed on the organic layer during a manufacturing process of the organic light emitting display device. Accordingly, there is a difference in an exposure amount between a region with the black matrix 271 and a region without the black matrix 271. That is, the black matrix may serve to control the light exposure amount for each region during an exposure process.

The black matrix 271 is formed in a non-pixel area of the organic light emitting display device to block light leakage on a boundary of a pixel or pixel area, thereby improving contrast.

In embodiments, the black matrix 271 may be formed by a photolithography method of coating opaque metal such as chromium (Cr) or chromium oxide (CrOx) or a black resin-based material which absorbs light on the entire surface of the protective layer 260 and then performing patterning through a mask process.

In alternative embodiments, the black matrix 271 may be formed by a vacuum deposition method using a micro transfer molding method. In addition, the black matrix 271 may be formed by various processing methods which are known in the art.

An organic layer 272 is formed on the black matrix 271 and the protective layer exposed through openings of the black matrix 271.

In embodiments, the organic layer 272 may have convex lens-shaped embossed portions raised or protruding in a light emitting direction. An angle ($\theta_1$) between the embossed portion and a surface parallel to the substrate may be in the range of about 10 degrees to about 70 degrees. Further, in an embodiment, a single embossed portion may be formed for each pixel, and in an alternative embodiment, two or more embossed portions may be formed for each pixel. In embodiments, a section of the organic layer 272 having each embossed portion can function as a micro convex lens.

The organic layer 272 may be formed of a negative photoresist composition. The negative photoresist commonly refers to a photoresist in which an exposed region remains as a pattern after exposing. A portion which is exposed to the light is chemically coupled, and a portion which is not exposed to the light is less washed by a developer during developing after exposing, thereby forming a pattern.

The negative photoresist composition which is usable as the organic layer 272 may be a photoresist which is generally known in the art, and may be a commercial product or may be manufactured and used.

Meanwhile, the organic layer 272 may be made of a material having a refractive index larger than a refractive index of the color filter 273 of about 1.5. Preferably, the organic layer 272 may be formed by using a material having a refractive index of about 1.7 or more.

The organic layer 272 may be made of a transparent material.

The organic layer 272 may be formed by using a novolac resin, hexa methoxy methyl melamine (HMMM) and an SU-8-based material.

All of the negative photoresist compositions which are known in the art may be used as a material of the organic layer 272.

In embodiments, a method of forming the convex lens-shaped, embossed portions on the organic layer 271 is performed by using a photolithography process.

The negative photoresist composition is uniformly coated on the protective layer 260 and entirely exposed by using an exposure apparatus such as a stepper.

Although the negative photoresist composition is entirely exposed on the organic layer 272, since a portion without the black matrix 271 is influenced again by light reflected onto the first electrode 220 and the second electrode 250 layers, the exposure amount becomes larger in the region without the black matrix 271 than in the region with the black matrix 271.

Since the organic layer 272 uses the negative photoresist composition in which a coupling force is increased in proportion to the exposure amount, a portion where the exposure amount is large reacts more than another portion where the exposure amount is not large, and as a result, the convex lens-shaped organic layer may be formed.

The color filters 273 are disposed on the organic layer 272. The color filter layer includes a red color filter 273R, a green color filter 273G, and a blue color filter 273B.

The color filters 273R, 273G, and 273B are formed at positions corresponding to the light emitting layers 240R, 240G, and 240B, respectively.

The color filter 273 may be formed by a process such as a pigment dispersion method, a dyeing method, an electrodeposition method, or a thermal transfer method. In addition, the color filter 273 may be formed by using methods of forming a color filter which are known in the art.

Figure 3A:
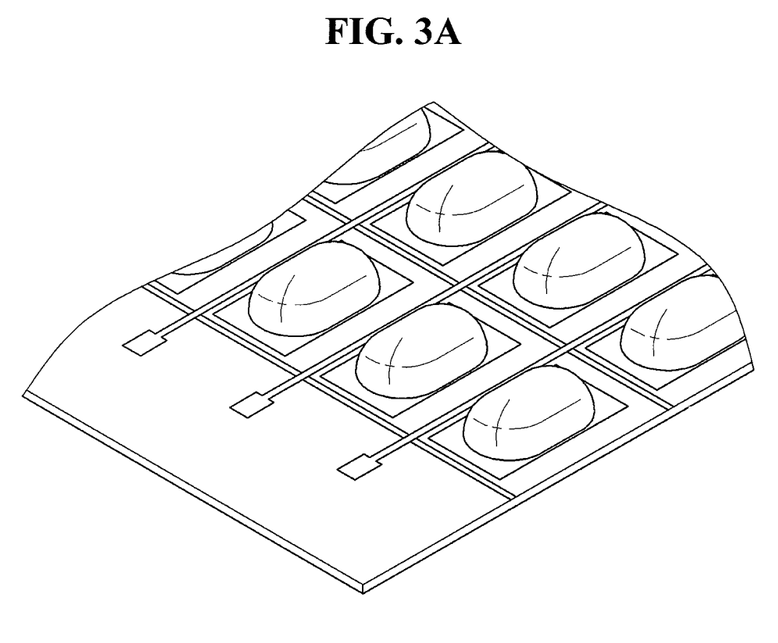
FIG. 3A is an example of an embossed portion shape formed on an organic layer in the embodiment of FIG. 2.

FIG. 3A is an example of embossed portions formed in the organic layer according to the embodiment of FIG. 2. As illustrated in FIG. 3A, a single embossed portion may be formed for each pixel on the organic layer.

Figure 3B:
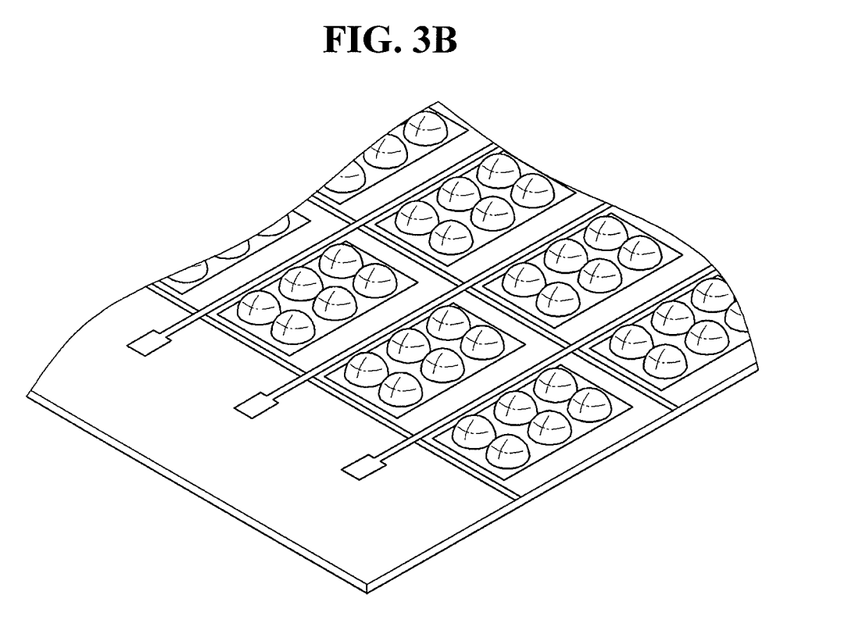
FIG. 3B is another example of an embossed portion shape formed on an organic layer in the embodiment of FIG. 2.

FIG. 3B is another example of embossed portions formed in the organic layer according to the embodiment of FIG. 2. As illustrated in FIG. 3B, two or more embossed portions may be formed for each pixel on the organic layer.

FIGS. 4A to 4J are diagrams for describing a manufacturing method of the organic light emitting display device according to the embodiment.

The organic light emitting display device according to the embodiment is formed by a method which includes forming a plurality of first electrodes 220 on the substrate 210 (see FIG. 4A), forming a pixel define electrode 230 among the plurality of first electrodes 220 (see FIG. 4B), forming light emitting layers 240R, 240G, and 240B on the first electrode 220 (see FIG. 4C), forming a second electrode 250 on the light emitting layer 240 (see FIG. 4D), forming a protective layer 260 on the second electrode 250 (see FIG. 4E), forming a black matrix pattern 271 on the protective layer 260 (see FIG. 4F), coating a negative photoresist composition on the protective layer 260 and the patterned black matrix 271 (see FIG. 4G), forming convex lens-shaped embossed portions by exposing the entire area of the negative photoresist composition coating and then developing the negative photoresist composition (see FIGS. 4H and 4I), and forming color filters 273R, 273G, and 273B having colors corresponding to the light emitting layers on the negative photoresist composition with the embossed portion. (see FIG. 4J)

<Light Extraction Efficiency>

A light extraction simulation model for verifying improvement of the light extraction efficiency of the organic light emitting display device according to the embodiment may be set as follows.

For comparison, an organic light emitting display device including a flat organic layer and a planar color filter may be set as Comparative Example. Here, a refractive index of the color filter is 1.5, and a general color filter is used.

The organic light emitting display device according to the embodiment may include the organic layer with a convex lens-shaped embossed portion formed in a light emitting direction (see FIG. 2). An angle between the embossed portion and the substrate is 60 degrees, and a refractive index of the organic layer with the embossed portion is 1.8. Here, the color filter is laminated on the organic layer, and a refractive index of the color filter is 1.5, and a general color filter is used.

Figure 5A:
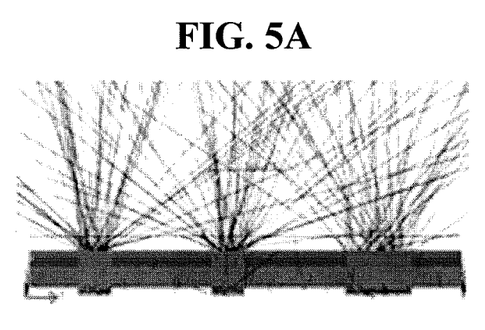
FIGS. 5A to 5B are examples of comparing light emitting efficiencies in Example of the present embodiment and Comparative Example.
Figure 5B:
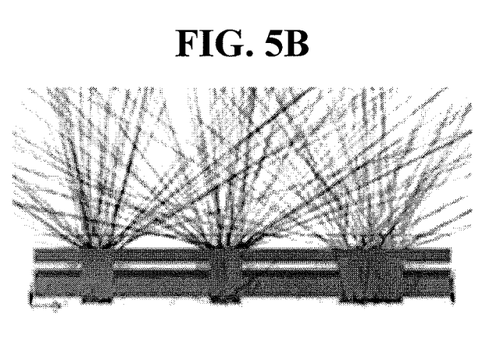

FIGS. 5A to 5B are simulation diagrams illustrating amounts of entirely emitted light in the organic light emitting display device of Comparative Example and the organic light emitting display device according to Example.

In the case where the organic layer with the convex lens-shaped embossed portion formed in a light emitting surface direction is included like the Example of the present embodiment, the amount of entirely emitted light may be increased to about 115% as compared with the case the embossed portion is not formed like the Comparative Example.

<Improvement of Viewing Angle>

Figure 6:
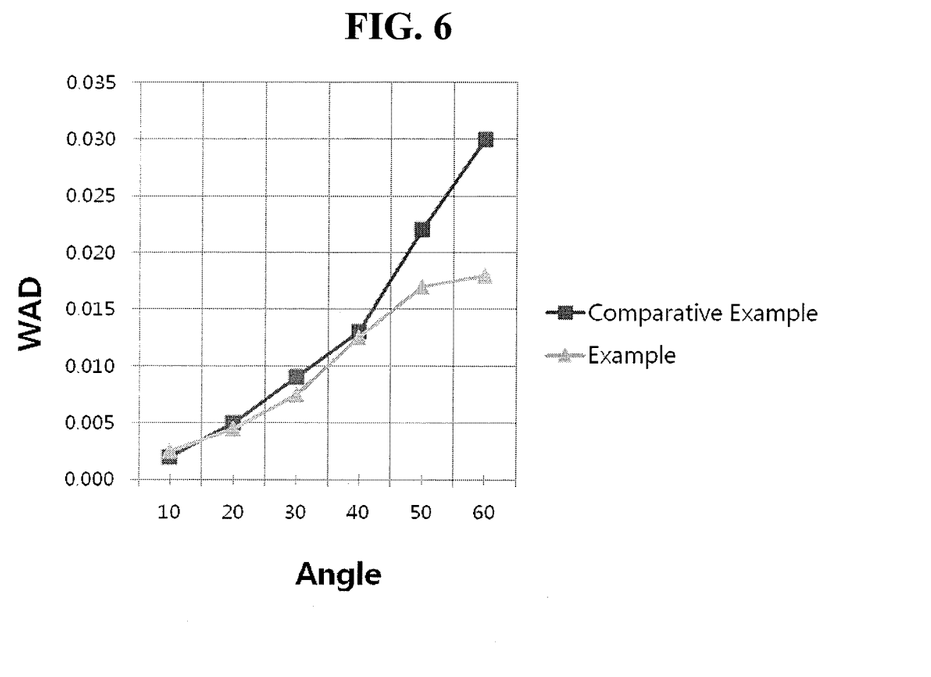
FIG. 6 is an example of comparing viewing angle characteristics of the organic light emitting display devices in Example of the present embodiment and Comparative Example.

FIG. 6 is an example of comparing viewing angle characteristics of organic light emitting display devices according to Example of the present embodiment and Comparative Example.

In a graph illustrated in FIG. 6, an x-axial direction represents an angle, and a y-axial direction represents a change of luminance. That is, after the luminance is measured in the range of 0 to 60 degrees based on a virtual line which is vertical to the light emitting surface, the graph illustrates a change of a luminance ratio at each angle to the luminance when the angle is 0 degree. Accordingly, as the change according to an angle change becomes smaller, the viewing angle characteristic may be excellent.

In FIG. 6, a WAD value of the Comparative Example is 0.03 at an angle of 60 degrees, and a WAD value of the Example of the present embodiment is 0.018 at an angle of 60 degrees. That is, the viewing angle characteristic of the organic light emitting display device including the organic layer with the embossed portion like the Example is improved more than the viewing angle characteristic of the structure without the embossed portion.

Figure 7:
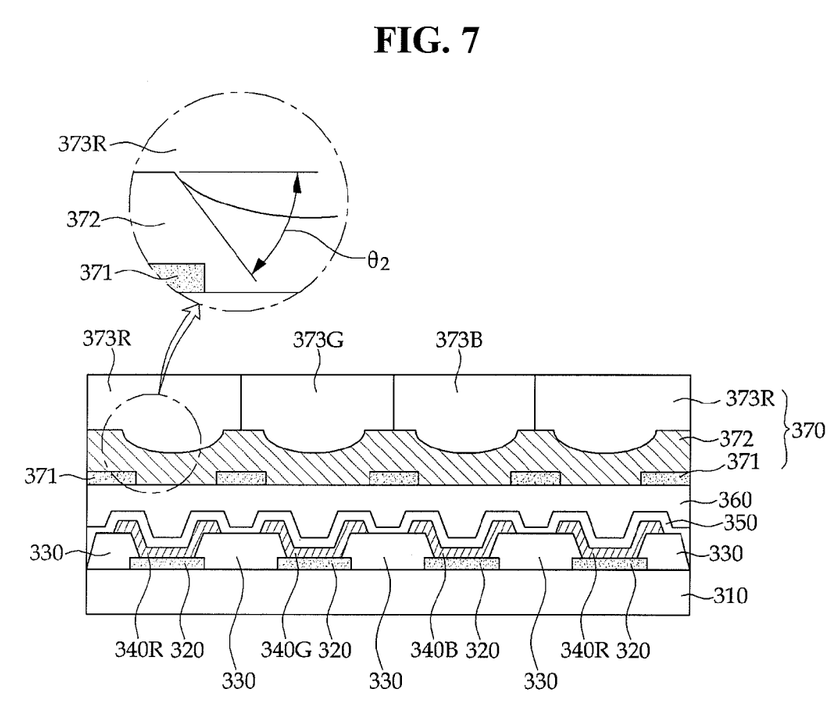
FIG. 7 is a diagram illustrating an organic light emitting display device according to another embodiment.

FIG. 7 is a diagram illustrating an organic light emitting display device according to another embodiment.

In embodiments, the organic light emitting display device of FIG. 7 includes a substrate 310, a plurality of first electrodes 320 formed on the substrate 310, a pixel defining layer 330 formed on or over the substrate and separating the plurality of first electrodes 320 from one another when viewed in a thickness direction of the display device, a plurality of light emitting layers 340R, 340G, and 340B formed above the first electrode 320, a second electrode 350 formed above the light emitting layer 340, a protective layer 360 formed on the second electrode 350, and a filter unit 370 formed above the protective layer 360. Here, the filter unit 370 includes a black matrix 371 formed at a position overlapping with the pixel defining layer 330 when viewed in the thickness direction, an organic layer 372 formed on the protective layer 360 where the black matrix 371 is patterned, and color filters 373R, 373G, and 373B formed above the organic layer 372 and having colors corresponding to the light emitting layers 340R, 340G, and 340B.

Among constituent elements of the organic light emitting display device of FIG. 7, duplicated description for like the constituent elements of the organic light emitting display device illustrated in FIG. 2 is omitted.

In embodiments, the organic layer 372 may have concave lens-shaped embossed portion sunken in a direction opposite to the light emitting direction. An angle ($\theta_2$) between the embossed portion and a surface parallel to the substrate may be in the range of about 10 degrees to about 70 degrees. Further, in an embodiment, a single embossed portion may be formed for each pixel, and in an alternative embodiment, two or more embossed portions may be formed for each pixel. In embodiments, a section of the organic layer 372 having each embossed portion can function as a micro concave lens.

The organic layer 372 may be made of a positive photoresist composition. The positive photoresist composition commonly refers to a photoresist in which a region except for the exposed region after exposing remains as a pattern. A portion which is exposed to the light is chemically decomposed and thus is washed off by a developer after exposing.

The positive photoresist composition which is usable as the organic layer 372 may be a photoresist which is generally known in the art, and may be a commercial product or may be manufactured and used.

Meanwhile, the organic layer 372 may be made of a material having a refractive index smaller than a refractive index of the color filter 373 of about 1.5. Preferably, the organic layer 372 may be formed by using a material having a refractive index of about 1.3 or less.

The organic layer 372 may be made of a transparent material.

The organic layer 372 may be made of a material such as poly methyl methacrylate (PMMA), poly methyl glutarimide (PMGI), a phenol formaldehyde resin (DNQ/Novolac) and an AZ-based photoresist.

All of the positive photoresist compositions which are known in the art may be used as a material of the organic layer 372.

A method of forming the concave lens-shaped embossed portion on the organic layer 372 is performed by using a photolithography process.

The positive photoresist composition is uniformly coated on the protective layer 360 and entirely exposed by using an exposure apparatus such as a stepper.

Although the positive photoresist composition is entirely exposed on the organic layer 372, since a portion without the black matrix 371 is influenced once again by light reflected onto the first electrode 320 and the second electrode 350, the exposure amount becomes larger in the region without the black matrix 371 than in the region with the black matrix 271.

Since the organic layer 372 uses the positive photoresist composition in which a decomposing force is increased in proportion to the exposure amount, a portion where the exposure amount is large reacts more than another portion where the exposure amount is not large, and as a result, the concave lens-shaped organic layer may be formed.

FIGS. 8A to 8D are diagrams for describing a manufacturing method of the organic light emitting display device according to another embodiment.

Figure 4A:
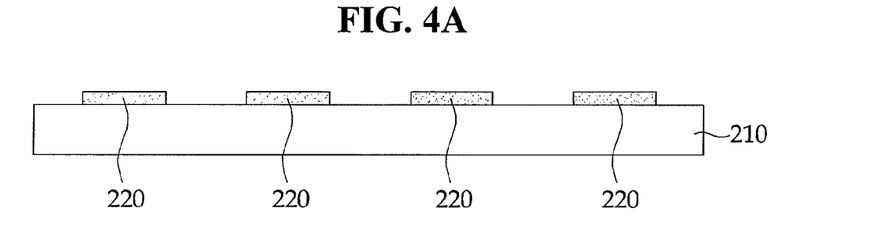
FIGS. 4A to 4J are diagrams for describing a manufacturing method of the organic light emitting display device according to the embodiment.
Figure 4B:
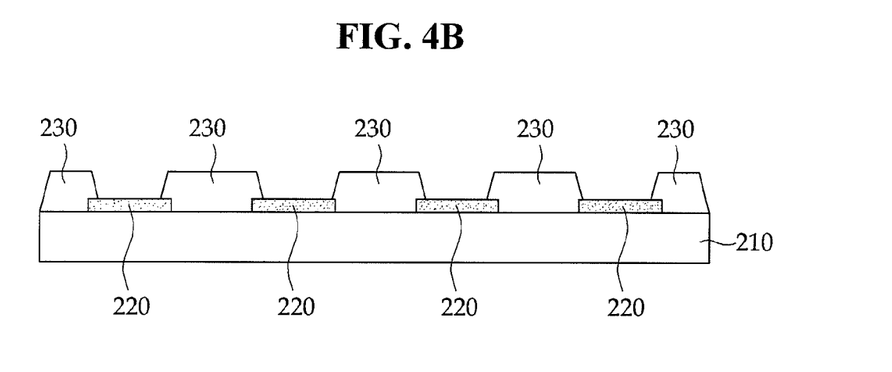
Figure 4C:
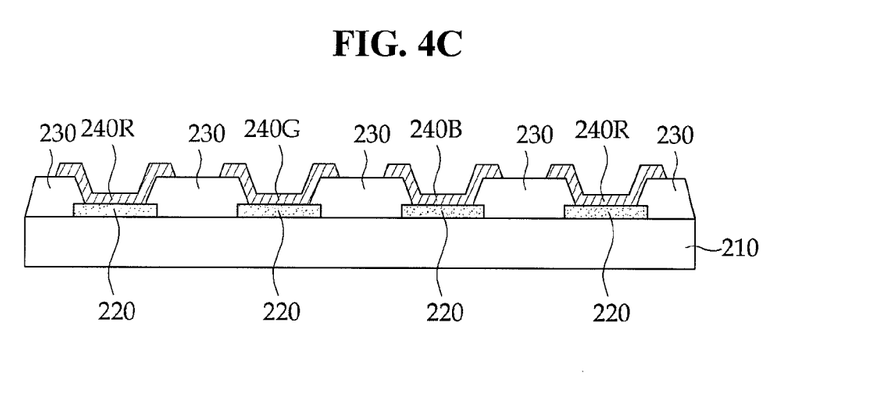
Figure 4D:
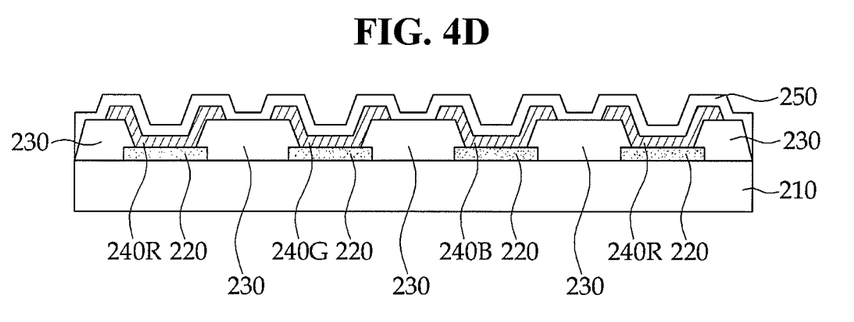
Figure 4E:
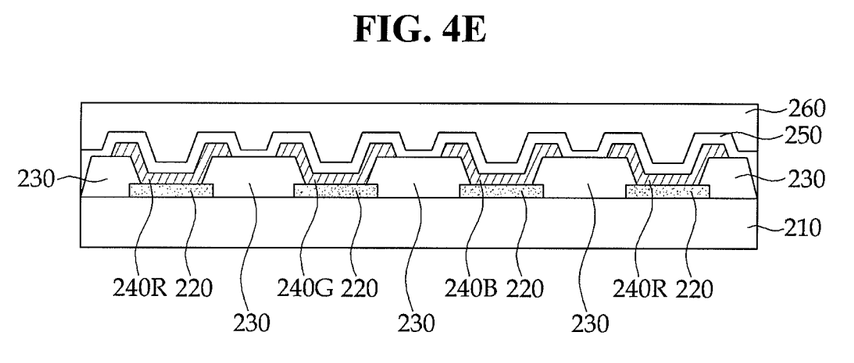
Figure 4F:
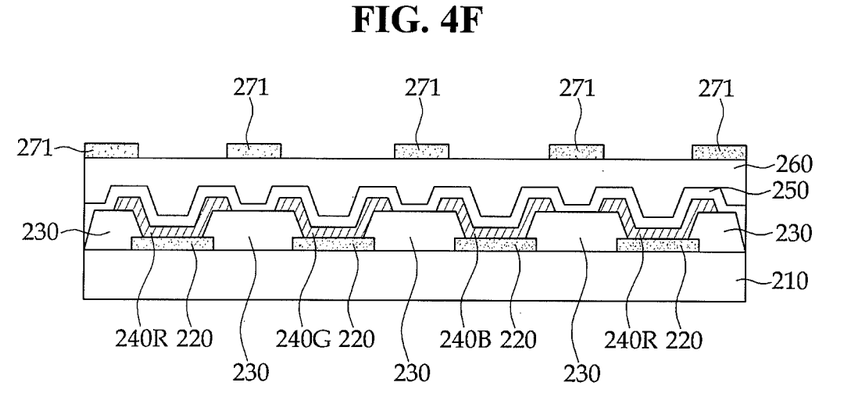
Figure 4G:
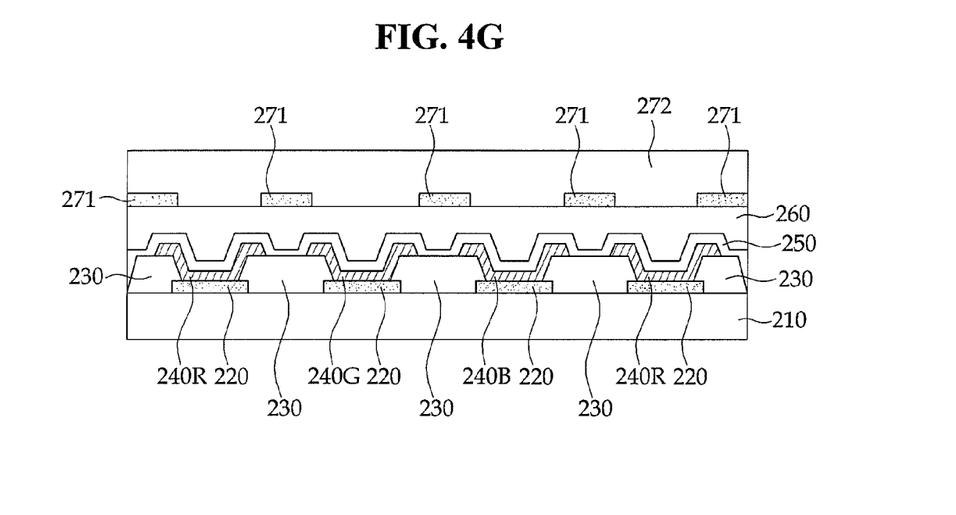
Figure 4H:
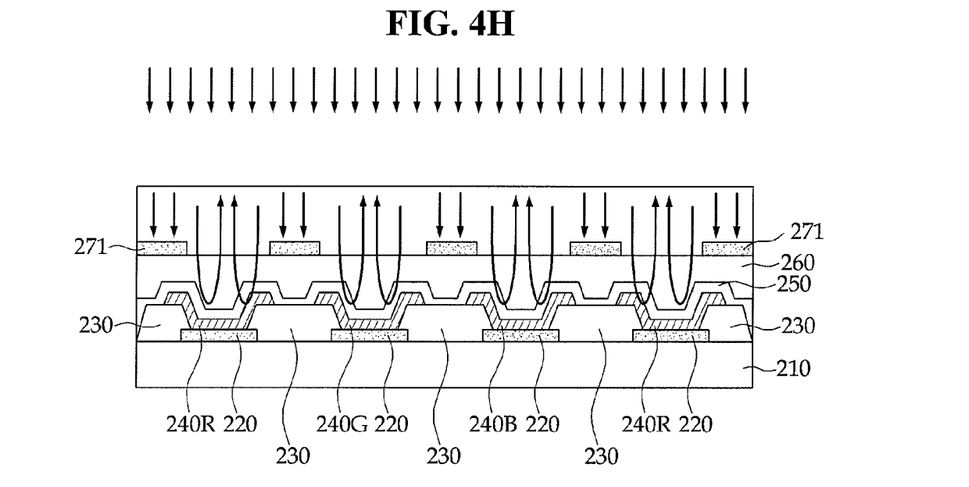
Figure 4I:
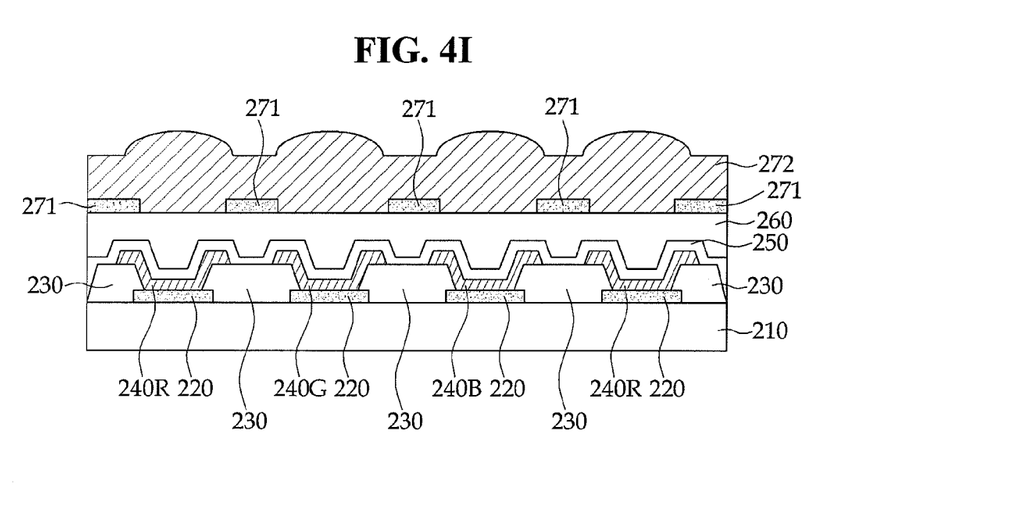
Figure 4J:
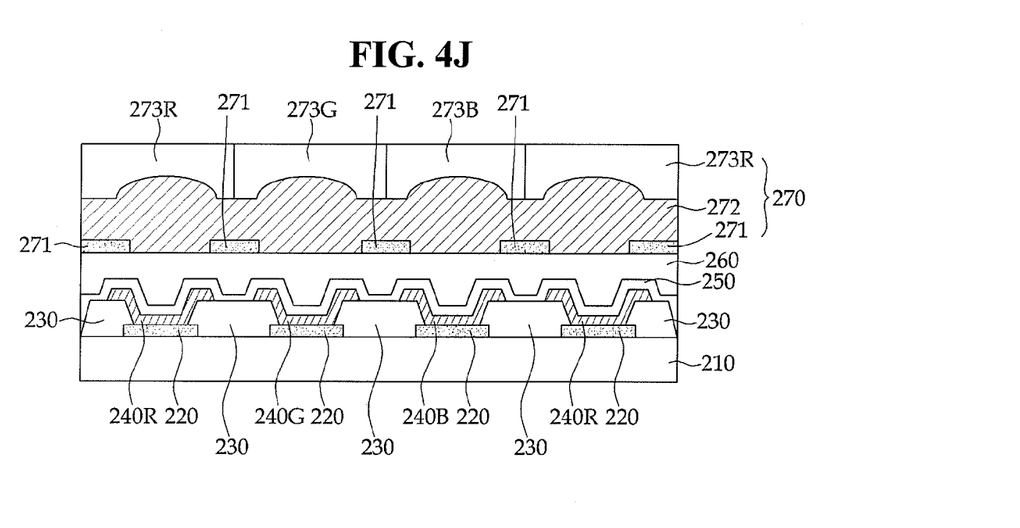

Here, processes after FIG. 4F, that is, forming a plurality of first electrodes 320 on the substrate 310, forming a pixel define electrode 330 among the plurality of first electrodes 320, forming light emitting layers 340R, 340G, and 340B on the first electrode 320, forming a second electrode 350 on the light emitting layer 340, forming a protective layer 360 on the second electrode 350, and forming a black matrix pattern 371 on the protective layer 360 are illustrated.

Figure 8A:
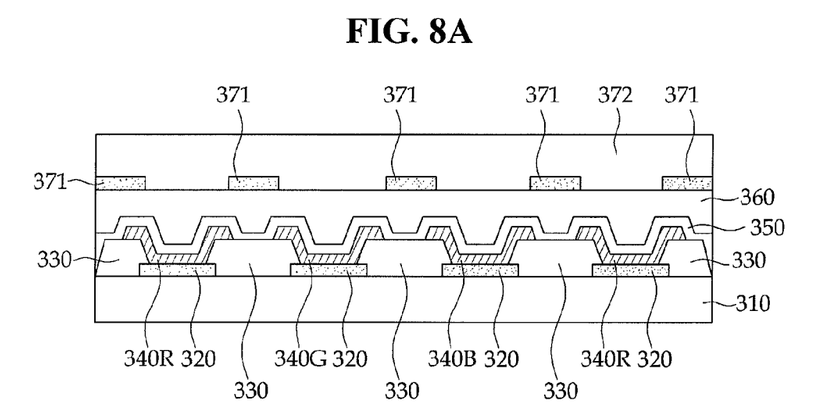
FIGS. 8A to 8D are diagrams for describing a manufacturing method of the organic light emitting display device according to another embodiment.
Figure 8B:
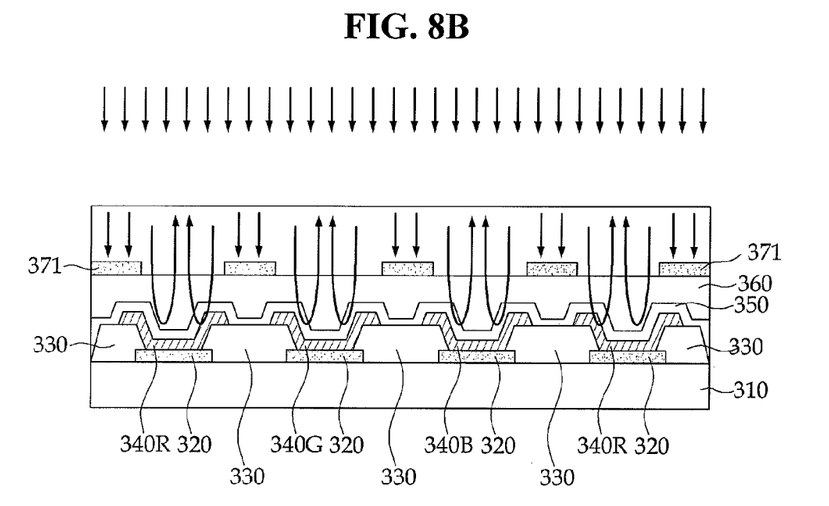
Figure 8C:
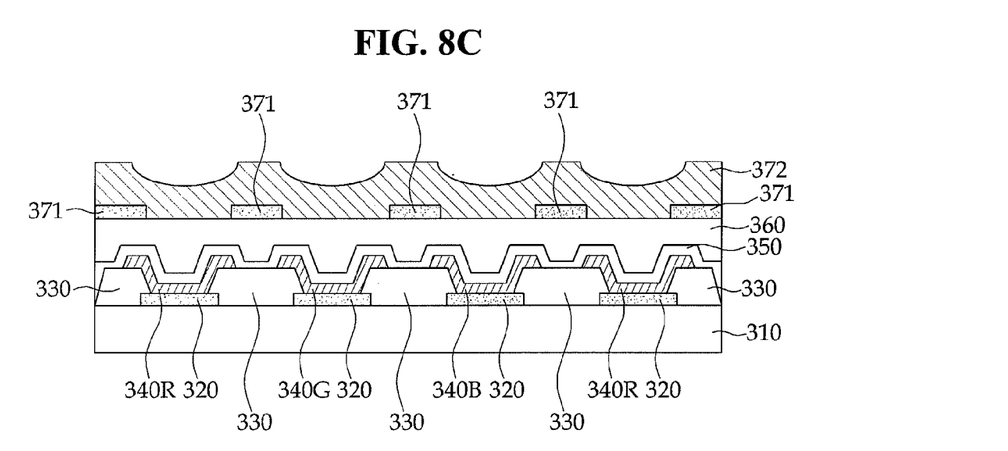
Figure 8D:
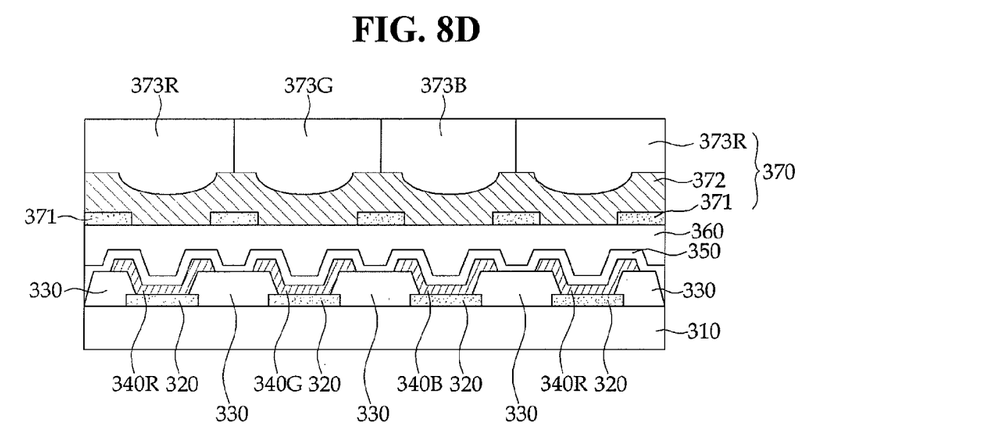

FIG. 8A illustrates coating a positive photoresist composition on the protective layer 360 and the patterned black matrix 371, FIGS. 8B and 8C illustrate forming concave lens-shaped embossed portions by exposing the entire area of the positive photoresist composition coating and then developing the positive photoresist composition, and FIG. 8D illustrates forming color filters 373R, 373G, and 373B having colors corresponding to the light emitting layers on the positive photoresist composition with the embossed portion. The organic light emitting display device illustrated in FIG. 7 may be manufactured by this method.

From the foregoing, it will be appreciated that various embodiments have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An organic light emitting display device, comprising:
a substrate comprising a major surface;
a pixel array comprising a plurality of pixels and formed over the major surface of the substrate, each pixel is configured to emit visible light in a direction away from the substrate;
a black matrix layer formed over the pixel array and providing a plurality of openings when viewed in a direction perpendicular to the major surface, each opening corresponding to one of the plurality of pixels;
a lens layer formed over the black matrix layer and comprising a plurality of lens portions, wherein when viewed in the direction, one or more lens portions correspond to one of the plurality of openings and also correspond to one of the plurality of pixels.

2. The organic light emitting display device of claim 1, wherein the plurality of pixels comprise a red light pixel, a green light pixel and a blue light pixel, wherein the device further comprising a plurality of color filters comprises a red filter, a green filter, and a blue filter which correspond to the red light pixel, the green light pixel, and the blue light pixel, respectively.

3. The organic light emitting display device of claim 1, wherein each of the plurality of pixels comprises a white light emitting material, and wherein the device further comprises a plurality of color filters comprising a red filter, a green filter and a blue filter, each of which is disposed over the white light emitting material of one of the plurality of pixels.

4. The organic light emitting display device of claim 1, further comprising a pixel defining layer configured to separate the plurality of pixels from one another when viewed in the direction, wherein the black matrix layer is formed to overlap the pixel defining layer when viewed in the direction.

5. The organic light emitting display device of claim 1, wherein the black matrix layer has a light absorptive property.

6. The organic light emitting display device of claim 1, wherein each of the lens portions has a convex-lens shape.

7. The organic light emitting display device of claim 1, wherein each of the lens portions has a concave-lens shape.

8. The organic light emitting display device of claim 1, wherein an angle between the lens portion and a surface parallel to the substrate is in the range of about 15 degrees to about 70 degrees.

9. The organic light emitting display device of claim 1, further comprising a plurality of thin film transistor layers formed over the substrate, and an insulation layer formed over the plurality of thin film transistor layers.

10. The organic light emitting display device of claim 1, further comprising a protective layer formed between the pixel array and the lens layer.

11. The organic light emitting display device of claim 1, wherein each pixel comprises first and second electrodes and a light emitting layer portion disposed between the first and second electrodes, wherein at least one of a hole injection layer and a hole transfer layer is disposed between the first electrode and the light emitting layer portion.

12. The organic light emitting display device of claim 1, wherein each pixel comprises first and second electrodes and a light emitting layer portion disposed between the first and second electrodes, wherein at least one of an electron injection layer and an electron transfer layer is disposed between the light emitting layer portion and the second electrode.

13. The organic light emitting display device of claim 1, wherein the lens layer is made of an organic material.

14. The organic light emitting display device of claim 1, wherein only one lens portion corresponds to one of the plurality of openings and also corresponds to one of the plurality of pixels, wherein the one lens portion is configured to diverge light beams emitted from its corresponding pixel as the light beams pass through the lens portion.

15. The organic light emitting display device of claim 1, further comprising a color filter over the lens layer.

16. The organic light emitting display device of claim 6, wherein the convex lens portions have a refractive index of about 1.7 or more.

17. The organic light emitting display device of claim 7, wherein a refractive index of the concave lens portions is about 1.3 or less.

18. The organic light emitting display device of claim 16, wherein the lens layer contains a negative photoresist composition.

19. The organic light emitting display device of claim 17, wherein the lens layer contains a positive photoresist composition.

20. The organic light emitting display device of claim 18, wherein the negative photoresist composition contains at least one selected from a group consisting of novolac resin, hexa methoxy methyl melamine (HMMM) and SU-8-based materials.

21. The organic light emitting display device of claim 19, wherein the positive photoresist composition contains at least one selected from a group consisting of poly methyl methacrylate (PMMA), poly methyl glutarimide (PMGI), phenol formaldehyde resin (DNQ/Novolac) and AZ-based materials.

22. An organic light emitting display device, comprising:
a substrate;
a plurality of first electrodes formed over the substrate;
a pixel defining layer (PDL) formed over the substrate, and separating the plurality of first electrodes from one another when viewed in a thickness direction of the display device;
a plurality of light emitting layer portions, each of which is formed over one of the plurality of first electrodes;
at least a second electrode formed over the plurality of light emitting layer portions; and
a filter unit formed over the at least a second electrode,
wherein the filter unit comprises:
a black matrix layer defining a plurality of openings;
an organic layer formed over the black matrix layer and the plurality of openings, and comprising a plurality of lens-shaped embossed portions; and
a plurality of color filters formed over the organic layer,
wherein the plurality of first electrodes, the plurality of light emitting layer portions and the at least a second electrode are configured to form a plurality of pixels which are separated from one another by the pixel defining layer when viewed in the thickness direction, the plurality of lens-shaped embossed portions are formed at an area corresponding to the plurality of pixels.

23. The organic light emitting display device of claim 22, wherein one of the plurality of embossed portions is formed for each of the plurality of pixels.

24. The organic light emitting display device of claim 22, wherein two or more embossed portions among the plurality of embossed portions are formed for each of the plurality of pixels.

* * * * *